United States Patent [19]
Williams et al.

[11] Patent Number: 5,225,796
[45] Date of Patent: Jul. 6, 1993

[54] COPLANAR TRANSMISSION STRUCTURE HAVING SPURIOUS MODE SUPPRESSION

[75] Inventors: Frank R. Williams, Banks; Thomas G. Ruttan, Lake Oswego, both of Oreg.

[73] Assignee: Tektronix, Inc., Wilsonville, Oreg.

[21] Appl. No.: 825,904

[22] Filed: Jan. 27, 1992

[51] Int. Cl.⁵ .............................. H01P 1/162
[52] U.S. Cl. ..................... 333/12; 333/238; 333/246; 385/2
[58] Field of Search ............ 333/238, 246, 12; 385/2, 3; 324/158 P

[56] References Cited

U.S. PATENT DOCUMENTS

| | | | |
|---|---|---|---|
| 3,863,181 | 1/1975 | Glance et al. | 333/246 X |
| 4,027,253 | 3/1977 | Chiron et al. | 333/238 X |
| 4,697,143 | 9/1987 | Lockwood et al. | 333/246 X |

*Primary Examiner*—Paul Gensler
*Attorney, Agent, or Firm*—William K. Bucher

[57] ABSTRACT

An improved coplanar transmission structure has a coplanar transmission line formed on one surface of a substrate and a lossy resistive material formed on the opposite surface of the substrate for suppressing spurious electromagnetic modes propagating through the substrate. The lossy resistive material may be nichrome or the like and is patterned on the substrate using thin or thick film processing.

16 Claims, 4 Drawing Sheets

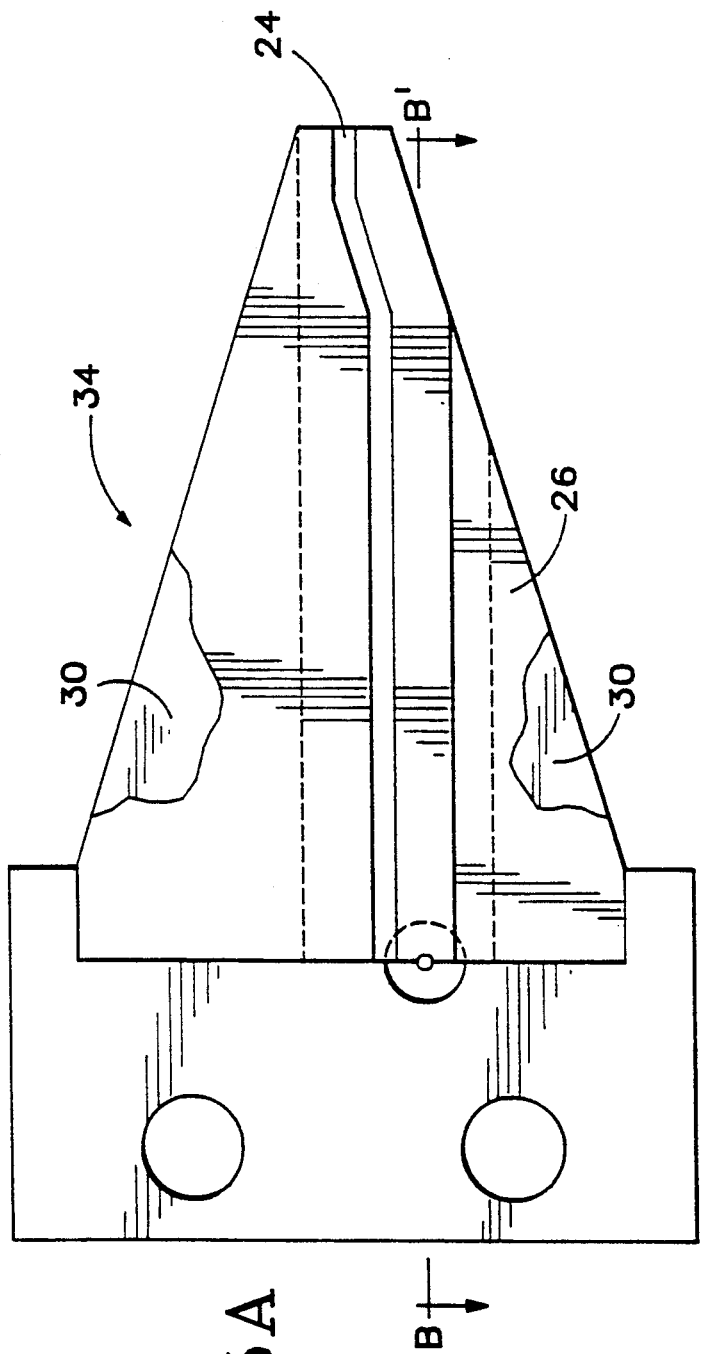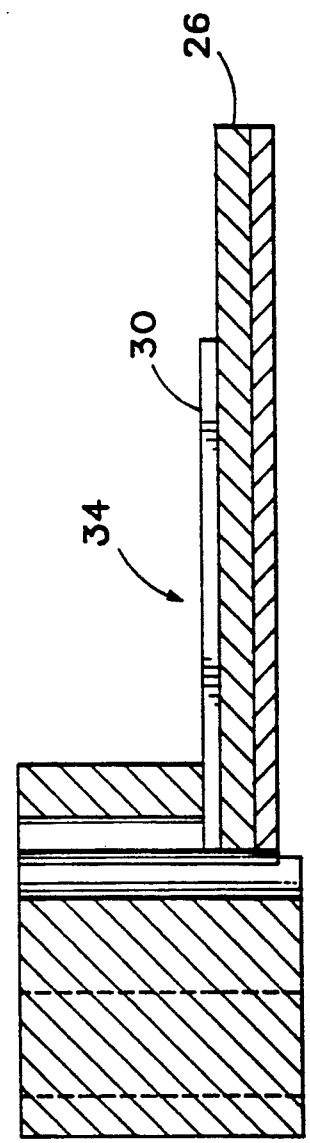
Fig. 5A
Fig. 5B

COPLANAR TRANSMISSION STRUCTURE HAVING SPURIOUS MODE SUPPRESSION

BACKGROUND OF THE INVENTION

The present invention relates to coplanar transmission structures and more particularly to an improved coplanar transmission structure for suppressing spurious electromagnetic modes propagating through the substrate of the structure.

Coplanar transmission structures, such as coplanar waveguides, coplanar striplines, slotlines, and the like, are used in a wide variety of electronic applications. For example, coplanar waveguides are used in microwave wafer probes, such as described in U.S. Pat. No. 4,697,143 to Cascade Microtech. Inc. The microwave probe has an approximately triangular shaped alumina ($Al_2O_3$) substrate on which is formed a coplanar waveguide that tapers toward the point of the triangle. Bulk microwave absorbing material containing iron or ferrite and having a high magnetic loss coefficient is secured on both surfaces of the substrate to absorb unwanted modes that propagate up the probe substrate and reflect off of the probe mounting block and back down the substrate producing resonance in the probe.

Microwave probes allow accurate on-wafer measurements of very small planar devices, such as transistors, inductors, capacitors, resistors, IC's Saw filters and the like at frequencies from DC to 100 GHz. Chip measurements of substantial accuracy can be made using microwave probes by connecting a network analyzer to a microwave probe and then calibrating the system using a calibration substrate The calibration substrate has various types of planar calibration elements formed on it, such as Line-Reflect-Line (LRL) calibration elements, Line-Reflect-Match (LRM) calibration elements, Open-Short-Load-Thru (OSL-T) calibration elements, and the like. Deviations from the ideal response of the probe/calibration substrate combination are stored in the network analyzer and software algorithms are used to compensate for these detected deviations as well as the non-ideal response of the network analyzer and the interface to the probe.

The calibration substrate is positioned on a metal chuck and is held in position by a vacuum. The chuck acts as a ground plane for the undesired microstrip modes when a signal is applied through the microwave probe. Besides the microstrip modes, surface wave modes propagate through the substrate. Recently, quartz spacers have been placed under the calibration substrate to reduce the parasitic modes generated in the calibration substrate. However, the parasitic modes still produce resonances in the incident to reflected signal ratio as measured by the network analyzer.

Attempts have been made to reduce the surface wave modes on the calibration substrate by applying a lossy material, such as nichrome, along the edges of the calibration elements. However, the dimension of the nichrome material is much shorter than the wavelength of the signal being coupled into the calibration element. Therefore, it has little effect on surface wave modes which propagate along the bottom surface of the substrate. Additionally, it has no effect on the microstrip modes generated by the metal chuck acting as a ground plane for the calibration elements.

In certain specific applications. such as yttrium-iron-garnet (YIG) oscillators, cast carbon based bulk absorbing materials is used. The carbon based bulk material has a RTV or epoxy binder, which allows it to be cast into shapes that fit into the YIG cavity. The frequency output of a YIG oscillator is dependent on the magnitude of a high magnetic field acting on YIG spheres in the oscillator cavity. The carbon based bulk material is transparent to the magnetic fields and has no affect on the operation of the YIG. Iron or ferrite magnetically loaded material, however, would disrupt the magnetic fields in the YIG. The carbon based bulk material has also been painted on lid covers of housing containing microwave circuits to suppress modes in the cavity.

Attempting to use the magnetically permeable or cast carbon based bulk microwave absorbing material, as taught in the '143 patent, under the calibration substrate would cause planarity problems between the probe and the calibration substrate. The signal and ground tips of the microwave probe must simultaneously contact the calibration substrate. The bulk absorbing material does not provide a flat uniform surface required for such precise alignment.

What is needed is a coplanar transmission structure that propagates only the mode defined by the transmission structure on a substrate and suppresses all the unwanted spurious modes that may be present in the substrate.

SUMMARY OF THE INVENTION

Accordingly, the present invention is an improved coplanar transmission structure for propagating a desired electromagnetic mode defined by a coplanar transmission line that is formed on one surface of a substrate. The improvement comprises a layer of lossy resistive material formed on the opposite surface of the substrate for suppressing spurious electromagnetic modes propagating through the substrate. Additionally, the lossy material, which may be a thin or thick film material, such as nichrome or tantalum nitride, may be formed on the side surfaces of the substrate. Further, the lossy material may be patterned on the substrate to meet specific mode suppression applications. In the preferred embodiment, the coplanar structures are coplanar waveguides, coplanar striplines, and slotlines.

These and other aspects of the present invention are set forth in greater detail in conjunction with the below references drawing and the accompanying detailed description.

BRIEF DESCRIPTION OF THE DRAWINGS

FIG. 5A is a bottom plan view of an improved microwave probe incorporating the improved coplanar transmission structure according to the present invention.

FIG. 5B is a cross-sectional view along line B—B' of the improved microwave probe incorporating the improved coplanar transmission structure according to the present invention.

DETAILED DESCRIPTION OF THE PREFERRED EMBODIMENT

Figure 1:
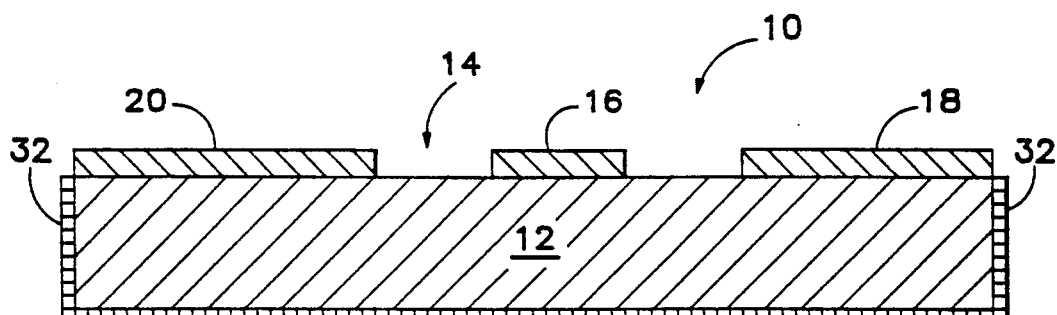
FIG. 1 is a cross-sectional view of improved coplanar transmission structure according to the present invention.

Referring to FIG. 1, there is shown a cross-sectional view of the coplanar transmission structure 10 according to the present invention. The coplanar transmission structure 10 includes a substrate 12 having a coplanar transmission line 14, shown as a coplanar transmission waveguide, formed on one surface thereof. The substrate 12 is formed from a dielectric material, such as alumina or sapphire. The coplanar transmission line 14 may also be a coplanar stripline or slotline without departing from the concept of the invention. The coplanar transmission waveguide 14 has a center strip 16 with two ground planes 18 and 20 located parallel to and in the plane of the center strip 16. The coplanar transmission line 14 defines the preferred electromagnetic mode of radiation propagating along the transmission line 14. In the preferred embodiment, the coplanar transmission line 14 is propagating a Quasi-TEM mode of radiation. The opposite surface of the substrate 12 has a layer of lossy resistive material 22, such as nichrome, tantalum nitride, or the like formed thereon. The lossy resistive layer 22 may be patterned on the substrate using well known photolithographic thin or thick film processes.

Figure 2A:
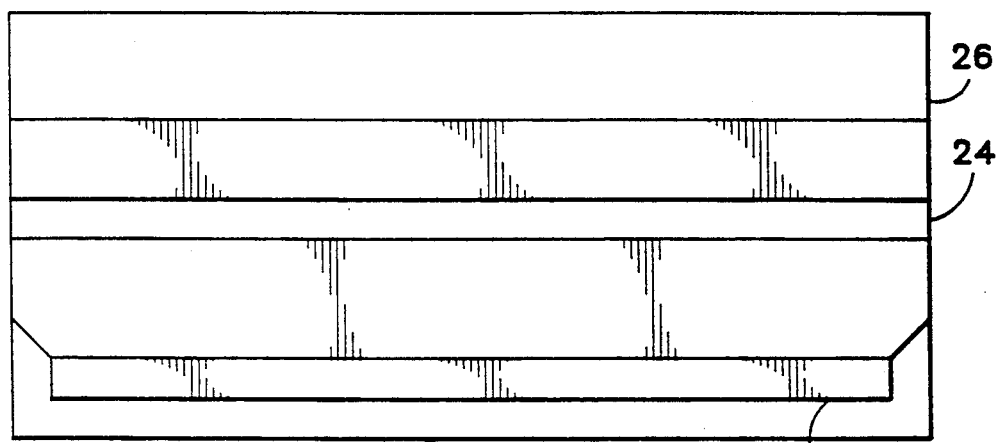
FIGS. 2A-B are plan and cross-sectional views of a coplanar stripline incorporating the coplanar transmission structure according to the present invention.
Figure 2B:
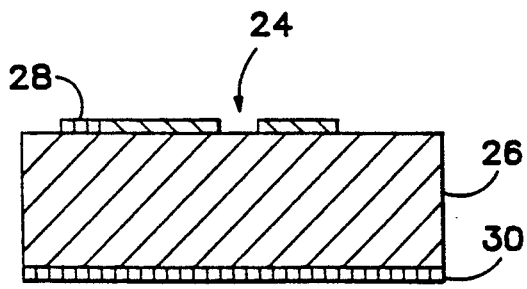

The use of a lossy resistive material specifically nichrome, has been shown to substantially reduce the parasitic electromagnetic modes propagating through the coplanar transmission structure. FIG. 2A shows a plan view of a coplanar transmission structure according to the present invention having an asymmetrical coplanar stripline 24 formed on one surface of a sapphire substrate 26 A layer of nichrome 28 is deposited adjacent to the stripline 24 as is known to do in the art. The cross-sectional view of FIG. 2B along cross-sectional line A—A' looking left shows the layer of nichrome 30 formed on the opposite surface of the substrate 26.

Tests were performed using coplanar transmission structures with and without the back-side nichrome of the present invention to prove the validity of using lossy resistive material on the opposite surface of the substrate from the coplanar transmission line. The coplanar transmission structure was placed on a metal chuck and a network analyzer was used to inject signals into the asymmetrical coplanar stripline through a microwave probe and the incident to reflected signal level ratio was plotted against the varying input signal frequencies to the stripline.

Figure 3A:
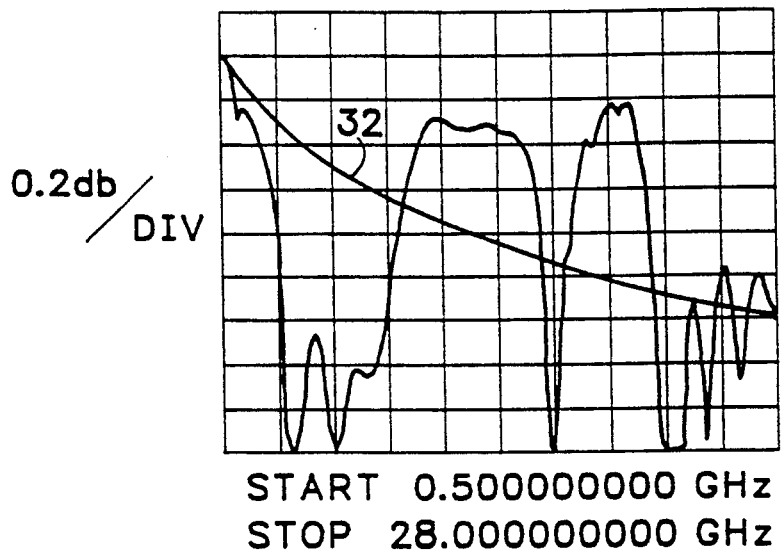
FIGS. 3A-B are network analyzer plots of coplanar stripline structures that do not incorporate the improved coplanar transmission structure according to the present invention.

FIG. 3A shows a network analyzer plot of the coplanar transmission structure using a stripline 24 without the nichrome layer formed on the opposite surface of the substrate 26. The plot of FIG. 3A shows regions of resonance where the electromagnetic energy is going into parasitic modes that are propagating through the substrate instead of the Quasi-TEM mode. Since coplanar striplines have significant loss at microwave frequencies, the ideal plot would be linear on a log scale as shown by line 32. As can be seen in the plot, there are substantial regions in the frequency spectrum where the parasitic modes are the dominant modes.

Figure 3B:
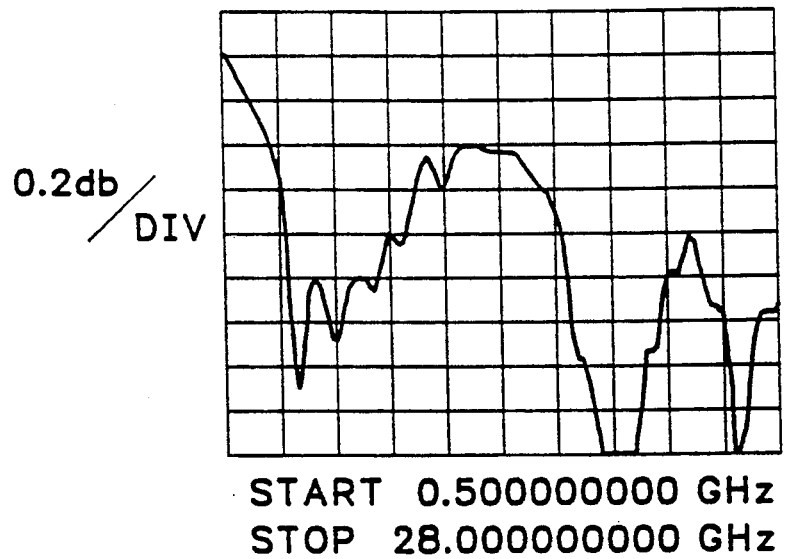

FIG. 3B shows a network analyzer plot of the same coplanar transmission structure with the structure placed on an 80 mil quartz spacer. The use of the quartz spacer improves the frequency response of the transmission structure but the parasitic modes still dominate producing resonances.

Figure 4A:
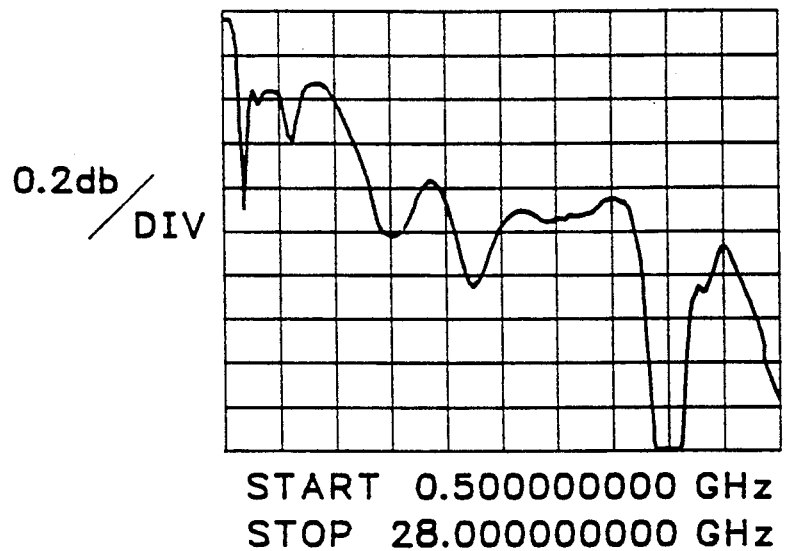
FIGS. 4A-B are network analyzer plots of coplanar stripline structures incorporating the improved coplanar transmission structure according to the present invention.

FIG. 4A shows a network analyzer plot of the improved coplanar transmission structure according to the present invention using the same asymmetrical coplanar stripline with the nichrome layer formed on the opposite surface of the substrate. The improved coplanar transmission structure was mounted directly on the metal chuck. As can be seen in the figure, there is substantial improvement in the incident to reflected signal energy ratio with the use of the back-side nichrome layer. The nichrome layer substantially reduces the microstrip modes that propagate through the substrate between the asymmetrical coplanar stripline and the ground chuck. Additionally, surface wave modes that are propagated along the bottom surface of the substrate are also substantially reduced. It is therefore evident that a coplanar transmission structure having a nichrome backside layer substantially propagates only the electromagnetic mode defined by the coplanar transmission line in the structure.

Figure 4B:
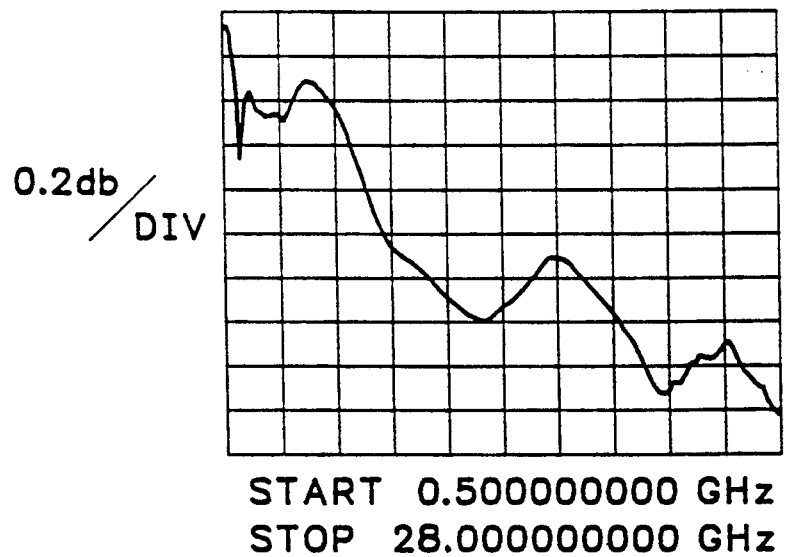

FIG. 4B shows another network analyzer plot where the improved coplanar transmission structure using the asymmetrical coplanar stripline has been placed on an 80 mil quartz spacer. The frequency response of the transmission structure is now approaching the ideal response as represented by line 32 in FIG. 3A. Further improvement may be achieved by patterning the lossy resistive material 32 on the side surfaces of the substrate. This should further reduce the spurious surface wave modes that have voltage maximums along the edge of the substrate.

The coplanar transmission structure of the present invention has distinct performance advantages over other previous coplanar transmission structures. The lossy resistive material is formed on the substrate using standard photolithographic thin or thick film processing, which allows precision patterning to micron levels. The thickness of the lossy resistive layer is in the range of a few hundred angstroms, which has no affect on the planarity of any device using the transmission structure of the invention. Such precision patterning of a thin lossy resistive layer is not possible with cast or painted on bulk materials. For example, current microwave probes use iron or ferrite bulk microwave material for damping magnetic fields in the device. The bulk absorbing material is spaced away from the substrate by the glue or other adhesive that is used to secure the material to the substrate. In addition, the bulk material must be set back from the probe tip to allow contact with a device under test (DUT). Further, flexing of the probe tip, is necessary for making good contact with the DUT, which requires the bulk material to be either spaced away from the coplanar waveguide structure or be of a less rigid material. These problems are overcome with the use of nichrome or other photolithographically patterned lossy resistive material on the coplanar transmission structure. The photolithographically patterned lossy resistive material provides a different loss mechanism instead of the complex permeability of the iron or ferrite bulk absorbing material. The photolithographically patterned nichrome is in intimated contact with the substrate whereas the bulk absorbing material has an adhesive layer between it and the substrate. It is felt that the parasitic mode suppression is improved with the lossy resistive material being in intimate contact with the substrate. Additionally, the nichrome or other photolithographically patterned lossy material may be used in conjunction with the bulk absorbing on both the top and bottom surface of the microwave probe substrate.

Further, the lossy resistive material may have different sheet resistances to match different application needs depending on the characteristic impedance of the DUT. Additionally patterning of the lossy material may be chosen to meet specific application needs. For example, one might want to slot the lossy resistive material normal to the direction of the coplanar transmission line to allow current in one direction and not the other. The present invention also provides an additional advantage in microwave probes 34 as is shown in the bottom plan view of FIG. 5A and the cross-sectional along line B—B' of FIG. 5B. Coplanar waveguide structures are used in microwave probes because of the parasitic mode problems associated with coplanar striplines. Using the coplanar transmission structure according to the present invention will allow the use of coplanar striplines 24 instead of coplanar waveguides. This will result in a space saving of thirty-five percent in the probe. This proves very important in very high density probes were multiple probe lines are patterned on a single probe. Further, the improved coplanar transmission structure may be used as interconnects in microwave modules where currently coplanar waveguides are used. Again using coplanar striplines in the coplanar transmission structure will produce a savings in real estate of thirty-five percent.

The coplanar transmission structure may also be used in optical modules, such as optical modulators, optical switches, and the like. Control electrodes are patterned on a substrate, such lithium niobate, for providing an RF signal to the device. The RF energy is applied through the electrodes for controlling the optical modulation or switching properties of the device. Patterning a resistive lossy material on the opposite surface of the substrate from the control electrodes will suppress parasitic modes that may interfere with the operation of the device.

An improved coplanar transmission structure has been described wherein a lossy resistive material, such as nichrome, is applied to the surface of a substrate containing a coplanar transmission line on the opposite surface. The lossy resistive material suppresses spurious electromagnetic modes propagating through the substrate. The lossy resistive material may also be applied to the side surfaces of the substrate. The coplanar transmission structure may be used i-n any application where electromagnetic modes are being propagated through a coplanar transmission line. These and other aspects of the invention are set forth in the appended claims.

We claim:

1. An improved coplanar transmission structure including a coplanar transmission line formed on one surface of a substrate for propagating a primary electromagnetic mode defined by the coplanar transmission line, the improvement comprising a photolithographic layer of lossy resistive material formed on the opposite surface of the substrate for suppressing electromagnetic modes propagating through and around the substrate that are spurious to the primary electromagnetic mode.

2. The improved coplanar transmission structure as recited in claim 1 further comprising a layer of lossy material formed on side surfaces of the substrate extending between the opposing substrate surfaces.

3. The improved coplanar transmission structure as recited in claim 2 wherein the lossy resistive material comprises nichrome.

4. The improved coplanar transmission structure as recited in claim 1 wherein the coplanar transmission line comprises a coplanar waveguide.

5. The improved coplanar transmission structure as recited in claim 1 wherein the coplanar transmission line comprises a coplanar stripline.

6. The improved coplanar transmission structure as recited in claim 1 wherein the coplanar transmission line comprises a slotline.

7. A coplanar transmission structure comprising:
a substrate having opposing parallel surfaces and side surfaces;
a coplanar transmission line formed on one of the opposing parallel surfaces for propagating a primary electromagnetic mode defined by the coplanar transmission line; and
a photolithographic lossy resistive layer formed on the opposite surface from the coplanar transmission line for suppressing electromagnetic modes propagating through and around the substrate that are spurious to the primary electromagnetic mode.

8. The coplanar transmission structure as recited in claim 7 further comprising a layer of lossy material formed on side surfaces of the substrate.

9. The coplanar transmission structure as recited in claim 8 wherein the lossy resistive material comprises nichrome.

10. The improved coplanar transmission structure as recited in claim 7 wherein the coplanar transmission line comprises a coplanar waveguide.

11. The improved coplanar transmission structure as recited in claim 7 wherein the coplanar transmission line comprises a coplanar stripline.

12. The improved coplanar transmission structure as recited in claim 7 wherein the coplanar transmission line comprises a slotline.

13. An improved microwave probe having a coplanar transmission line formed on one surface of a substrate for propagating a primary mode of electromagnetic radiation defined by the coplanar transmission line, the improvement comprising a photolithographic layer of lossy resistive material selectively covering one or more surfaces of the substrate for suppressing electromagnetic modes propagating through and around the substrate that are spurious to the primary mode of electromagnetic radiation.

14. The improved microwave probe as recited in claim 13 wherein the lossy resistive material is patterned on the substrate for providing selective suppression of parasitic modes of radiation.

15. The improved microwave probe as recited in claim 13 wherein the resistive lossy material is nichrome.

16. The improved microwave probe as recited in claim 13 wherein the coplanar transmission line comprises a coplanar stripline.

* * * * *